US010818807B2

(12) United States Patent
Jacob et al.

(10) Patent No.: US 10,818,807 B2
(45) Date of Patent: Oct. 27, 2020

(54) SEMICONDUCTOR DETECTORS INTEGRATED WITH BRAGG REFLECTORS

(71) Applicant: GLOBALFOUNDRIES INC., Grand Cayman (KY)

(72) Inventors: Ajey Poovannummoottil Jacob, Watervliet, NY (US); Theodore J. Letavic, Putnam Valley, NY (US); Abu Thomas, Chestnut Hill, MA (US); Yusheng Bian, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/253,191

(22) Filed: Jan. 21, 2019

(65) Prior Publication Data
US 2020/0235252 A1  Jul. 23, 2020

(51) Int. Cl.
| | | |
|---|---|---|
| *H01L 31/02* | (2006.01) | |
| *H01L 31/18* | (2006.01) | |
| *G02B 1/11* | (2015.01) | |
| *G02B 5/08* | (2006.01) | |
| *H01L 31/0232* | (2014.01) | |
| *H01L 31/0216* | (2014.01) | |
| *G02B 1/113* | (2015.01) | |

(52) U.S. Cl.
CPC ........ *H01L 31/02327* (2013.01); *G02B 1/113* (2013.01); *G02B 5/0816* (2013.01); *H01L 31/02161* (2013.01); *H01L 31/1804* (2013.01)

(58) Field of Classification Search
CPC ......... H01L 31/02327; H01L 31/02161; H01L 31/1804; G02B 1/113; G02B 5/0816
See application file for complete search history.

(56) References Cited

U.S. PATENT DOCUMENTS

| | | | | |
|---|---|---|---|---|
| 5,448,536 A | * | 9/1995 | Muranishi ............... | G11B 7/127 369/13.28 |
| 5,767,507 A | * | 6/1998 | Unlu ........................ | G01J 4/04 250/214.1 |
| 6,266,712 B1 | * | 7/2001 | Henrichs ............... | G06F 3/0608 710/8 |
| 6,323,480 B1 | * | 11/2001 | Tran ..................... | G02B 6/4214 250/214.1 |
| 6,380,531 B1 | * | 4/2002 | Sugihwo ................ | B82Y 20/00 250/214.1 |

(Continued)

OTHER PUBLICATIONS

Todd W. Du Bosq et al., High reflectivity intracavity Bragg mirrors for the far-infrared p-Ge laser, SPIE, Sep. 2004, 1-7, vol. 5, USA.

(Continued)

*Primary Examiner* — Ida M Soward
(74) *Attorney, Agent, or Firm* — David Cain

(57) ABSTRACT

The present disclosure generally relates to semiconductor detectors for use in optoelectronic devices and integrated circuit (IC) chips, and methods for forming same. More particularly, the present disclosure relates to integration of semiconductor detectors with Bragg reflectors. The photodetector of the present disclosure includes a substrate, a Bragg reflector disposed on the substrate, and a semiconductor detector disposed on the Bragg reflector. The Bragg reflector includes alternating layers of a semiconductor material and a dielectric material.

10 Claims, 19 Drawing Sheets

(56) References Cited

U.S. PATENT DOCUMENTS

| | | | | |
|---|---|---|---|---|
| 6,782,027 | B2* | 8/2004 | Cox | H01S 5/18355 372/50.1 |
| 6,841,795 | B2* | 1/2005 | Taylor | H01L 29/802 257/14 |
| 7,170,918 | B2* | 1/2007 | Grosse | B82Y 20/00 257/E31.033 |
| 7,211,821 | B2* | 5/2007 | Atanackovi | B82Y 20/00 257/21 |
| 7,759,644 | B2* | 7/2010 | Mitra | G01J 3/36 250/338.4 |
| 7,901,870 | B1* | 3/2011 | Wach | G02B 5/28 430/321 |
| 8,634,078 | B2* | 1/2014 | Sieben-Xu | G01N 21/553 356/445 |
| 8,710,530 | B2* | 4/2014 | Yang | H01L 33/10 257/98 |
| 9,923,118 | B2* | 3/2018 | Shatalov | H01L 33/10 |
| 2003/0047752 | A1* | 3/2003 | Campbell | H01L 31/107 257/186 |
| 2003/0103542 | A1* | 6/2003 | Cox | H01S 5/18355 372/96 |
| 2004/0217264 | A1* | 11/2004 | Wood | G01J 5/20 250/214 R |
| 2006/0227823 | A1* | 10/2006 | Mohammed | B82Y 20/00 372/26 |
| 2013/0050686 | A1* | 2/2013 | Wunderer | H01S 5/18363 356/128 |
| 2017/0005207 | A1* | 1/2017 | Li | H01L 31/02005 |
| 2020/0035843 | A1* | 1/2020 | Zhao | H01L 31/02161 |
| 2020/0194474 | A1* | 6/2020 | Meynants | H01L 27/14685 |

OTHER PUBLICATIONS

Matthew K. Emsley et al., Silicon Substrates With Buried Distributed Bragg Reflectors for Resonant Cavity-Enhanced Optoelectronics, IEEE Journal of Selected Topics in Quantum Electronics, Jul./Aug. 2002, 948-955, vol. 8, No. 4, San Francisco, CA, USA.

Jialin Jiang et al., Design and analysis of a CMOS-compatible distributed Bragg reflector laser based on highly uniaxial tensile stressed germanium, Optics Express, Mar. 20, 2017, 6497-, 6510, vol. 25, No. 6, OSA Publishing, Washington, D.C. USA.

Jan Petykiewicz et al., Direct Bandgap Light Emission from Strained Ge Nanowires Coupled with High-Q Optical Cavities, Physics. Optics, Aug. 6, 2015.

Niels Quack et al., Mid-Infrared Tunable Resonant Cavity Enhanced Detectors, Sensors, Sep. 4, 2008, 5466-5478, MDPI Open Access.

Dongjunseo et al., Light Absorption Efficiency-Improved GE on Si P-I-N. Photodetector by Using Step-Chirped Bragg Grating, International Journal of Electrical, Electronics and Data Communication, Apr. 26-29, 2017, vol. 5, Issue-4, India.

J L Shen et al., Reflectivity and photoluminescence studies in Bragg reflectors with absorbing layers, Institute of Physics Publishing, Apr. 24, 2001, 548-552, IOP Publishing Ltd, UK.

Tsung-Ting Wu et al., A critically coupled Germanium photodetector under vertical illumination, Optics Express, Dec. 31, 2012, 1-9, vol. 20, No. 28, OSA, USA.

* cited by examiner

US 10,818,807 B2

SEMICONDUCTOR DETECTORS INTEGRATED WITH BRAGG REFLECTORS

FIELD OF THE INVENTION

The present disclosure generally relates to semiconductor detectors for use in optoelectronic devices and integrated circuit (IC) chips, and methods for forming same. More particularly, the present disclosure relates to integration of semiconductor detectors with Bragg reflectors.

BACKGROUND

In the optoelectronics industry, LIDAR (also known as Light Detection and Ranging) is one of the key enabling technologies and platforms for potentially revolutionary advances in the optical communication systems, data communications, security, and sensing. LIDAR is a remote sensing technology that uses light to measure variable distances. Advances in LIDAR technology have enabled practitioners to scan large area surfaces (e.g., high resolution maps), while collecting billions of data points, each with a precise latitude, longitude and elevation (x, y, z) values within the local (relative) coordinate system. Various optoelectronic devices can be developed for LIDAR applications. These optoelectronic devices typically contain photodetectors manufactured using semiconductor processes. A greater efficiency of light absorption is required for the implementation of these photodetectors into LIDAR technology.

Ideally, it is desirable to have the photodetector achieve light absorption efficiency as close as possible to 100 percent. However, in practice, when light is illuminated on the detector, a significant amount of light escapes through the detector body, and the efficiency of light absorption are greatly reduced. Further, the illumination angles of incident light on the detector may vary to a large extent, which also negatively affects the light absorption and sensitivity of the detector.

Therefore, it is desirable to obtain a semiconductor detector with enhanced light absorption efficiency and a constant absorption of light for a range of illumination angles.

SUMMARY

In one aspect of the present disclosure, there is provided a photodetector including a substrate, a Bragg reflector disposed on the substrate, the Bragg reflector having alternating layers of a semiconductor material and a dielectric material, and a semiconductor detector disposed on the Bragg reflector.

In another aspect of the present disclosure, there is provided a substrate, a plurality of Bragg reflectors disposed on the substrate, each Bragg reflector including alternating layers of a semiconductor material and a dielectric material, an inter-array dielectric layer separating each Bragg reflector, and one or more semiconductor detectors disposed on each Bragg reflector.

In a further aspect of the present disclosure, there is provided a method of forming a photodetector including forming a heterostructure on a substrate, the heterostructure having alternating layers of a conversion layer and a semiconductor material layer, forming a semiconductor detector on the heterostructure, converting the conversion layers of the heterostructure to dielectric material layers, thereby forming a Bragg reflector, and forming electrical connections on the semiconductor detector and the Bragg reflector.

Advantageously, the integration of Bragg reflectors with semiconductor detectors is found to improve light absorption efficiency of the photodetector.

BRIEF DESCRIPTION OF THE DRAWINGS

The present disclosure may be understood by reference to the following description taken in conjunction with the accompanying drawings.

Figure 1A:
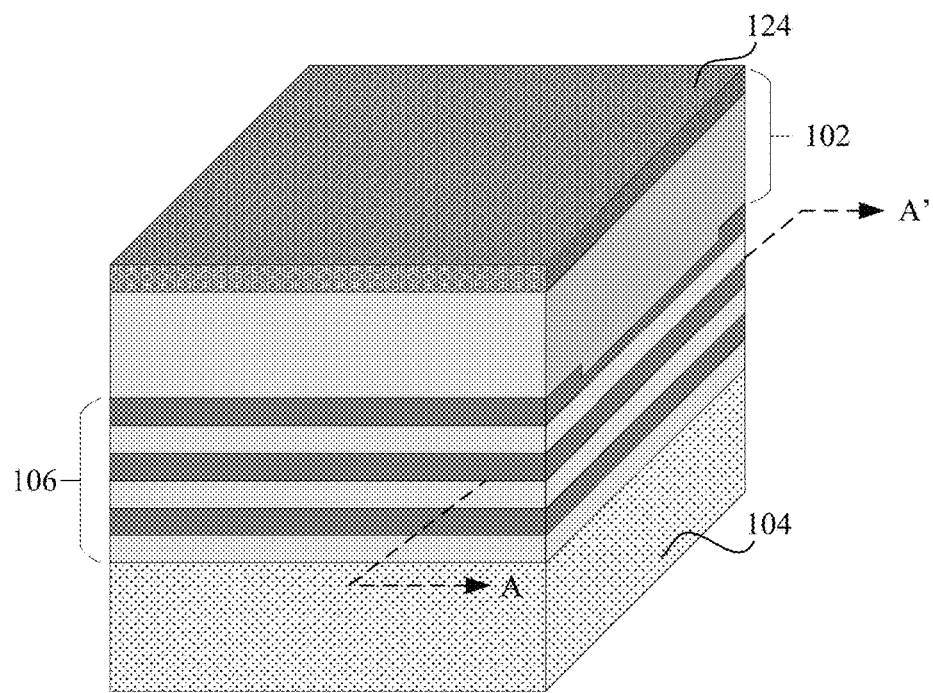
FIGS. 1A, 2A, 3A, 4A, 5A, 6A and 7A show perspective views of a partially processed structure at successive stages of forming a photodetector in accordance with an embodiment of the present disclosure.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Referring to FIG. 1A, a perspective view of a partially processed structure at successive stages of forming a photodetector in accordance with an embodiment of the present disclosure is depicted. The partially processed structure includes a substrate 104, a heterostructure 106 disposed on the substrate 104, and a semiconductor detector 102 disposed on the heterostructure 106. The semiconductor detector 102 includes a doped layer 124, as shown in FIG. 1A. The heterostructure 106 includes alternating layers of a conversion layer and a semiconductor material.

The term "heterostructure" as used herein refers to a structure having different materials vertically integrated with the material interface meeting at heterojunctions. The term "heterojunction" as used herein describes an interface between two layers or regions of materials with different crystal structure.

In one embodiment, the heterostructure 106 is disposed between the semiconductor detector 102 and the substrate 104. The substrate 104 may be made of any suitable semiconductor material, such as silicon, germanium, silicon germanium (SiGe), silicon carbide, and those consisting essentially of III-V compound semiconductors, such as GaAs, II-VI compound semiconductors such as ZnSe. The substrate 104 may include a semiconductor-on-insulator substrate or a bulk semiconductor substrate. Examples of a semiconductor-on-insulator substrate may include, but not limited to, an organic semiconductor or a layered semiconductor, such as Si/SiGe, a silicon-on-insulator (SOI), a germanium-on-insulator (GOI), or a SiGe-on-insulator. A portion or entire semiconductor substrate 104 may be amorphous, polycrystalline, or monocrystalline. In one embodiment, the substrate 104 is a silicon-on-insulator substrate having a buried oxide layer in the substrate body. The buried oxide layer contains silicon dioxide. In another embodiment, the substrate 104 is a silicon substrate. The thickness of the substrate 104 may be in the range of about 6 nm to about 700 μm.

Figure 1B:
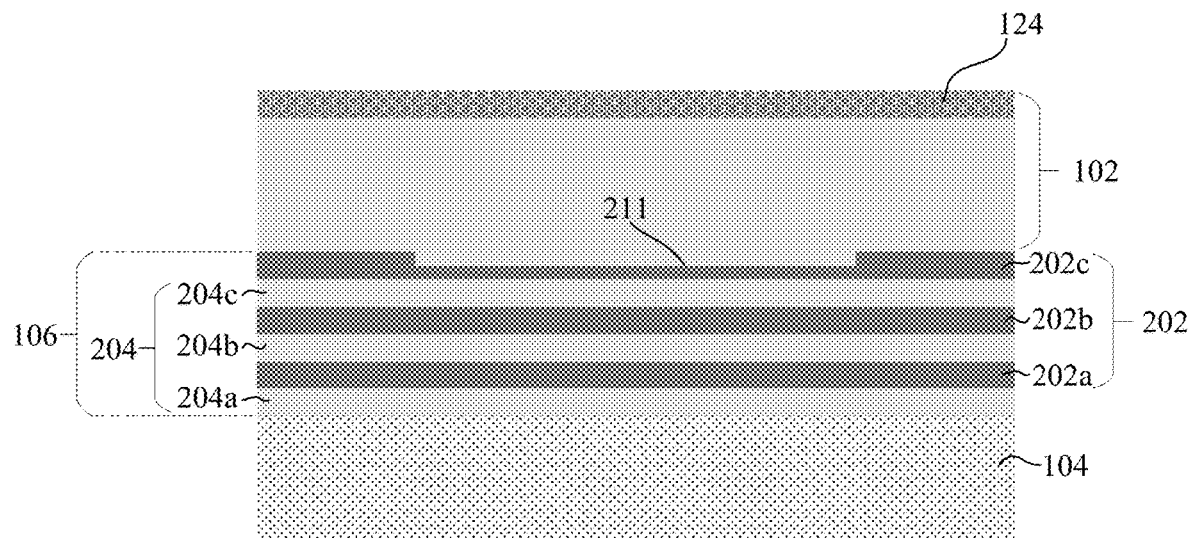
FIGS. 1B, 2B, 3B, 4B, 5B, 6B and 7B show cross section views of the same partially processed structures (taken along lines A-A', B-B', C-C', D-D', E-E', F-F', and G-G' as indicated in FIGS. 1A, 2A, 3A, 4A, 5A, 6A and 7A, respectively) according to an embodiment of the present disclosure.

Referring to FIG. 1B, a cross section view of the partially processed structure of FIG. 1A is shown. The heterostructure 106 may be formed by epitaxial growth or deposition of alternating layers of materials on the substrate 104. Formation of the alternating layers of materials may be performed using chemical vapor deposition (CVD) or any epitaxy technique, such as molecular beam epitaxy (MBE), liquid phase epitaxy, vapor phase epitaxy, or solid phase epitaxy. The heterostructure 106 is preferably formed using CVD or MBE.

The alternating layers may include the conversion layer paired with the semiconductor material. For example, the conversion layer is disposed on the semiconductor material in each pair of layers. Alternatively, the semiconductor material is disposed on the conversion layer in each pair of layers. As shown in FIG. 1B, the heterostructure 106 includes alternating layers of semiconductor material layers 202a, 202b and 202c, and conversion layers 204a, 204b and 204c. The semiconductor material layers 202a, 202b and 202c are of a different material from the conversion layers 204a, 204b and 204c. In one embodiment, the semiconductor material layers 202 are preferably silicon, or monocrystalline silicon. In another embodiment, the conversion layers 204 include germanium or SiGe. A portion or entire conversion layers 204 may be amorphous, polycrystalline, or monocrystalline. In one embodiment, the entire conversion layers 204 are preferably monocrystalline SiGe or germanium.

The heterostructure 106 may be formed by depositing a conversion layer 204a on the substrate 104, followed by depositing a semiconductor material layer 202a on the formed conversion layer 204a. Next, another conversion layer 204b is then deposited on the formed semiconductor material layer 202a, followed by depositing another semiconductor material layer 202b on the previously formed conversion layer 204b. These steps may be repeated to produce a plurality of semiconductor material layers 202, and a plurality of conversion layers 204. The semiconductor material layers 202 and the conversion layers 204 are stacked vertically over the substrate 104, as shown in FIG. 1B. A heterojunction is formed at interfaces between two alternating layers of the heterostructure.

The thickness of the alternating layers may be derived from the wavelength of incident light and the refractive index of the material. For example, the thickness of each layer may be represented by an expression $\lambda/(4*\eta_{material})$, where $\eta_{material}$ is the refractive index of the selected material and X is the wavelength of the incident light. The thickness of the semiconductor material layers and the conversion layers may be uniform or non-uniform. The semiconductor material layers 202 may have a thickness in the range of about 100 nm to about 200 nm, and the conversion layers 204 may have a thickness in the range of about 200 nm to about 240 nm.

The heterostructure 106 may include a top layer and a bottom layer. The top and bottom layers may be of the same or different materials. For example, the top layer is the semiconductor material layer 202c while the bottom layer is the conversion layer 204a, or vice versa. Alternatively, both the top and bottom layers could be either the semiconductor material or the conversion layer. The doping of the top layer 202c may be performed by in-situ doping during the epitaxial growth of the top layer 202c. The doping may be performed by any suitable ion-implantation or solid source diffusion technique. Suitable dopants used herein may include, but not limited to, N-type dopants (e.g. phosphorous, arsenic), P-type dopants (e.g. boron).

A semiconductor detector 102 is formed on the heterostructure 106, as shown in FIG. 1B. The semiconductor detector 102 may be formed on the top layer 202c by deposition (e.g., CVD) or epitaxial growth (e.g., molecular beam epitaxy). The semiconductor detector 102 may be of a different material from the top layer 202c. In one embodiment, the semiconductor detector 102 is preferably formed by epitaxial growth on the top layer 202c. In-situ doping is performed on a top surface of the semiconductor detector 102 during the epitaxial growth. Alternatively, a semiconductor film (not shown) is additionally formed on top of the semiconductor detector by epitaxial growth. In-situ doping is performed on the semiconductor film to form the doped layer 124 in the semiconductor detector 102. The semiconductor film may include silicon or germanium. The semiconductor detector has a preferred thickness of about 250 nm to about 1000 nm. In various embodiments, the semiconductor detector includes germanium containing compounds. In some embodiments, the germanium containing compound is germanium only or SiGe. As will be described below in subsequent stages of the processing steps, the in-situ doping of the top layer 202c and the semiconductor detector 102 creates PN or PIN junctions of the photodetector in accordance with the present disclosure.

In the embodiment shown in FIGS. 1A and 1B, a recess 211 in the top layer 202c is formed by performing lithography and etching processes prior to forming the semiconductor detector 102. It should be understood that lithography and etching processes as described herein includes deposition of material or photoresist, patterning, exposure, development, etching, cleaning, and/or removal of the material or photoresist as required in forming a described structure in semiconductor fabrication. The semiconductor detector 102 is disposed in the recess 211 of the top layer 202c, as shown in FIG. 1B.

Figure 2A:
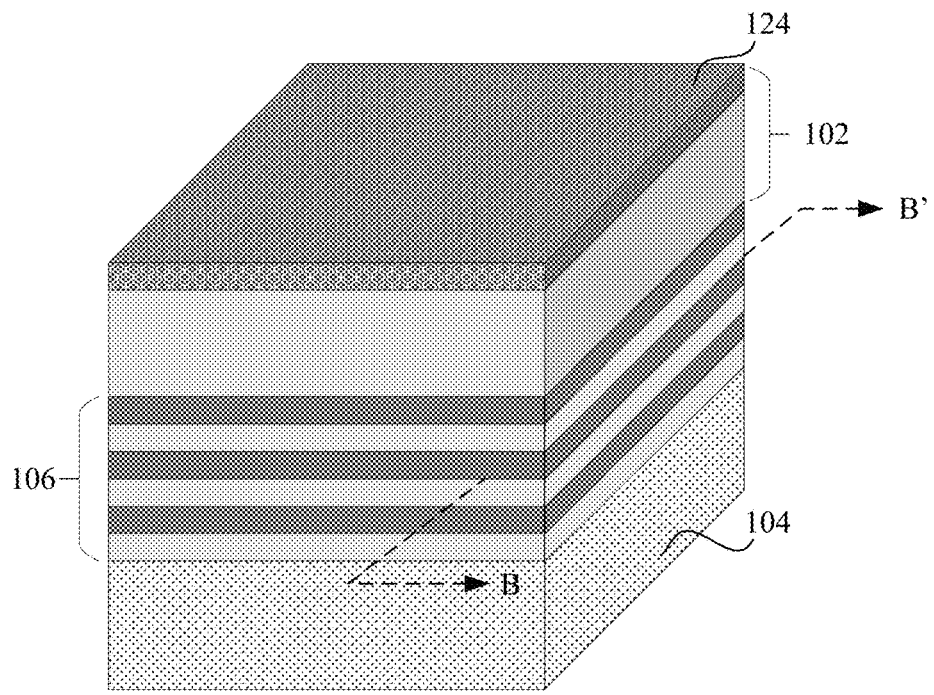
Figure 2B:
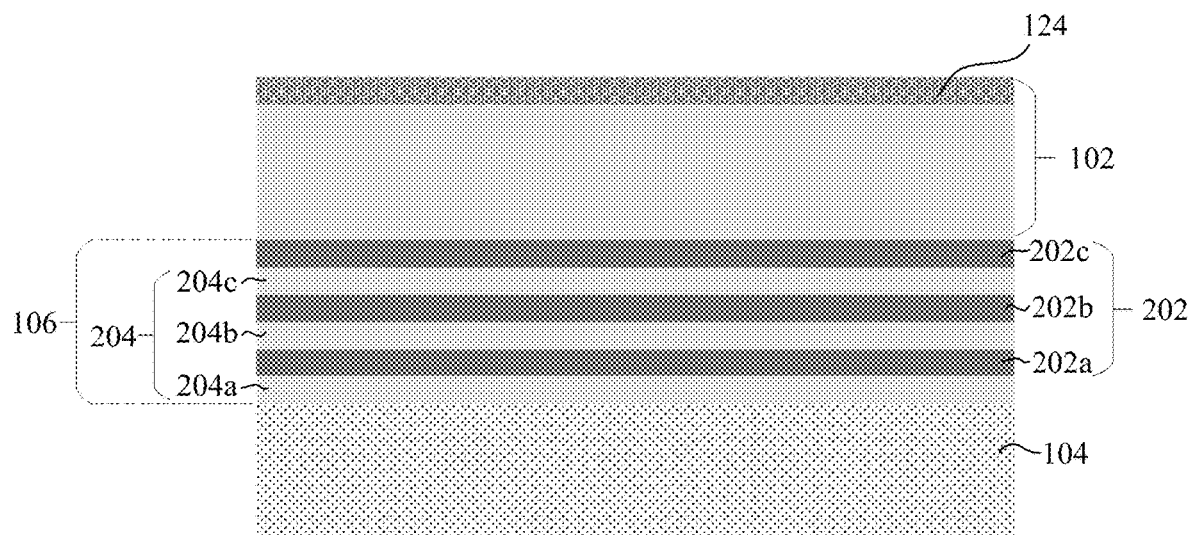

FIGS. 2A and 2B show perspective and cross-section views respectively of an alternative embodiment of the partially processed structure described herein. In the alternative embodiment, the top layer 202c does not have a recess, and the semiconductor detector 102 is disposed on the top layer 202c, as shown in FIG. 2B.

Figure 3A:
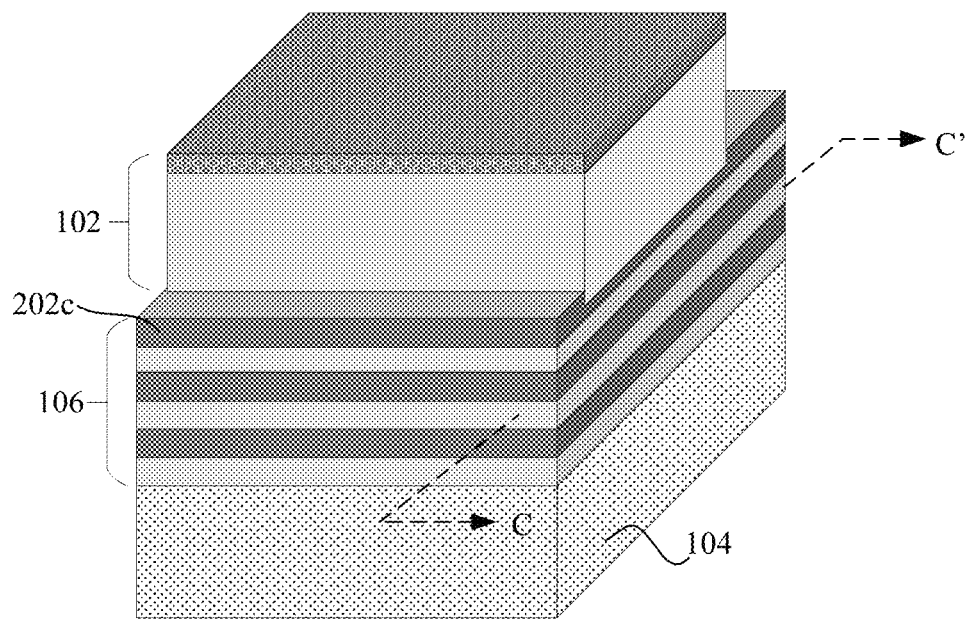
Figure 3B:
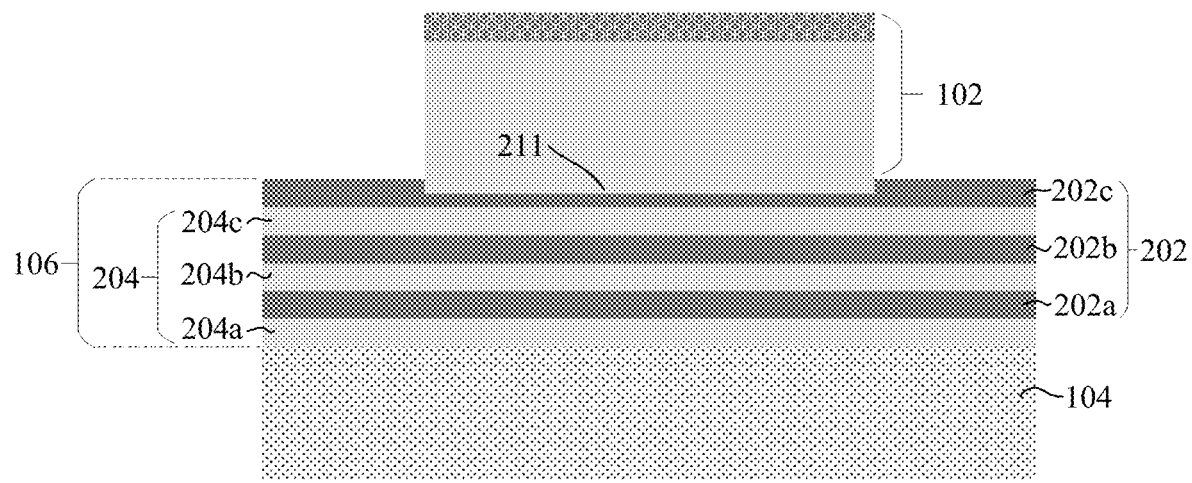
Figure 4A:
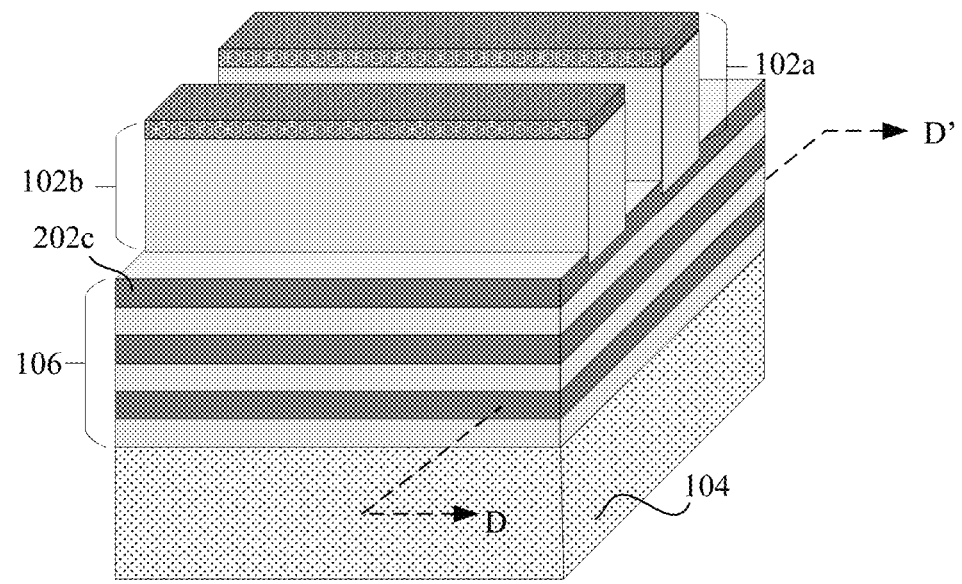
Figure 4B:
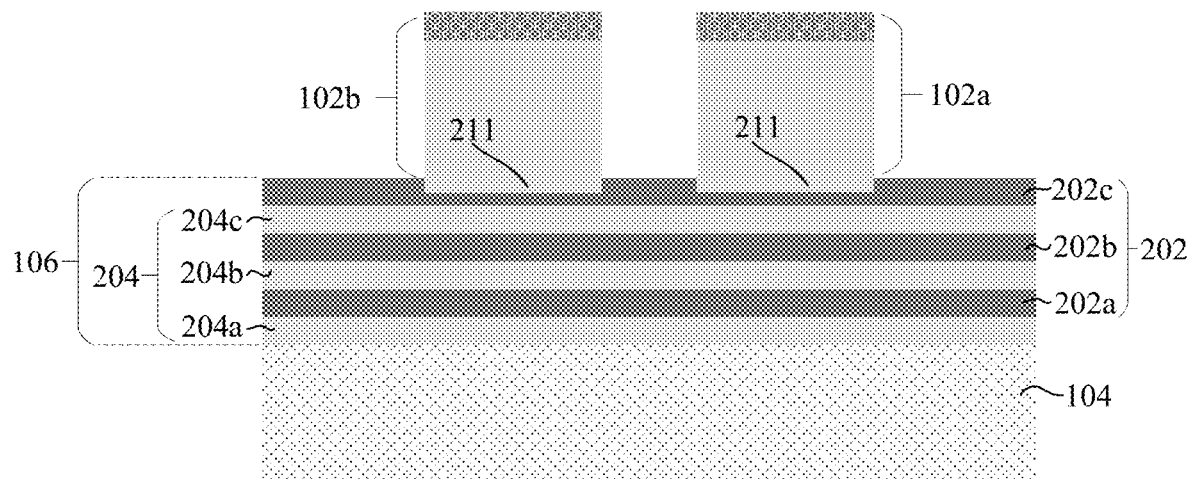

Referring to FIGS. 3A and 3B, there is shown a perspective view and a cross section view respectively of an embodiment of a partially processed structure after removing a portion of the semiconductor detector 102 to expose the top layer 202c. The removal of a portion of the semiconductor detector 102 may be preferably performed by lithography and etching processes. In one embodiment, a portion of the semiconductor detector 102 is etched to form a single semiconductor detector structure, as shown in FIGS. 3A and 3B. In an alternative embodiment, the removal of a portion of the semiconductor detector 102 forms one or more semiconductor detector structures 102a and 102b spaced apart from each other, as shown in FIGS. 4A and 4B.

Figure 5A:
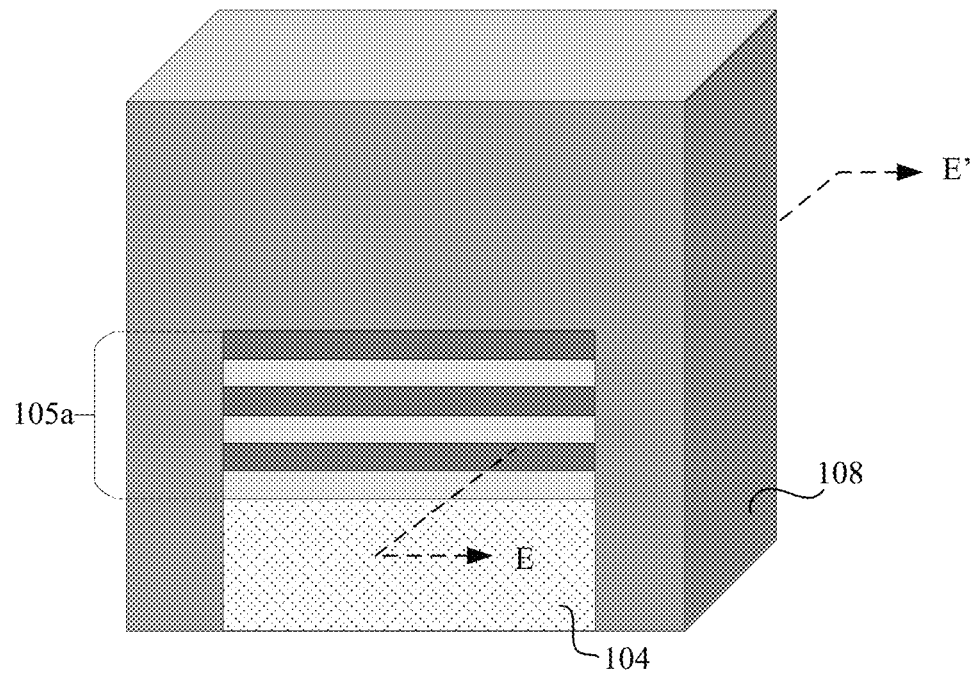
Figure 5B:
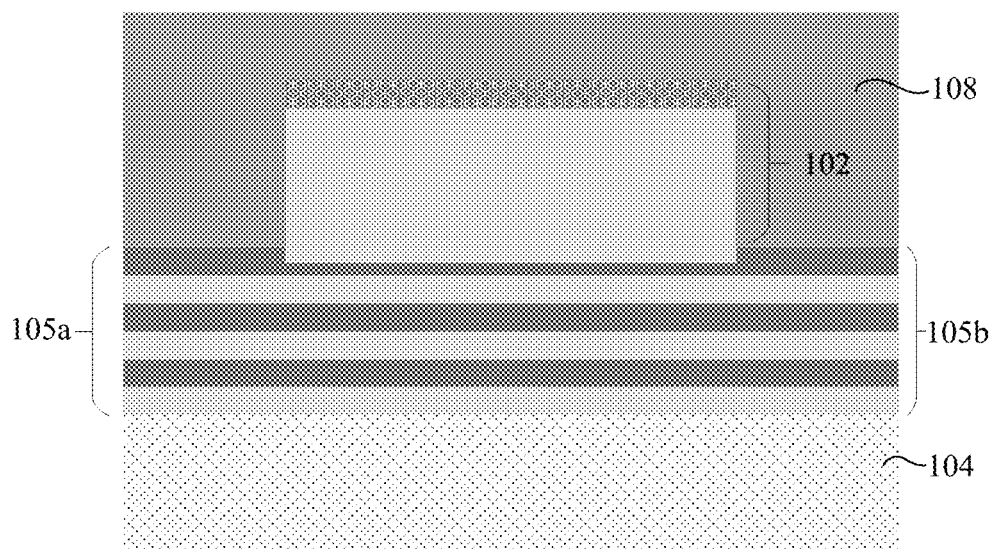

Referring to FIGS. 5A and 5B, there is shown a perspective view and a cross section view respectively of a partially processed structure after forming an anti-reflection layer 108 in accordance with an embodiment of the present disclosure. As used herein, the term "anti-reflection layer" refers to a material or materials which function to provide an anti-reflective property to a substrate on which said material or materials is applied. A material having good or excellent anti-reflective property means it has small reflectance and large transmittance.

The anti-reflection layer 108 may be deposited on the semiconductor detector 102. In one embodiment, the semiconductor detector 102 has top and side surfaces that are covered by the anti-reflection layer 108, and the anti-reflection layer 108 generates stress on the semiconductor detector 102. The deposition process may be performed using any deposition techniques such as CVD, physical vapor deposition (PVD), or spin-coating. In another embodiment, the anti-reflection layer 108 is formed by conformal deposition. The anti-reflection layer 108 may be deposited to surround the semiconductor detector 102 and the heterostructure. Next, an etching process may be performed to expose sides 105a and 105b of the heterostructure, as shown in FIGS. 5A and 5B. The anti-reflection layer 108 may include a nitride compound. In one embodiment, the anti-reflection layer 108 includes silicon nitride. In some embodiments, the anti-reflection layer has a thickness of about 200 nm.

Advantageously, by covering the top and side surfaces of the semiconductor detector 102 with the anti-reflection layer 108, it is found that the anti-reflection layer 108 also functions as a stress-inducing layer for generating stress on the semiconductor detector 102. For example, the generated stress is a function of the density of the anti-reflection layer (e.g., density of silicon nitride layer) and may be compressive or tensile. Surprisingly, it is found that the generated stress by the anti-reflection layer improves the on/off (e.g., forward and reverse biased) performance of the semiconductor detector.

At successive stages of the processing steps of the present disclosure, the conversion layers of the heterostructure are converted to dielectric material layers and the heterostructure becomes a Bragg reflector. As used herein, the term "dielectric" describes a substance that is a poor conductor of electricity and can be polarized by an applied electrical field. The converting of conversion layers to dielectric material layers may include either selectively removing the conversion layers and replacing with a dielectric material, or performing an oxidation process on the conversion layers to form the dielectric material layers.

Figure 6A:
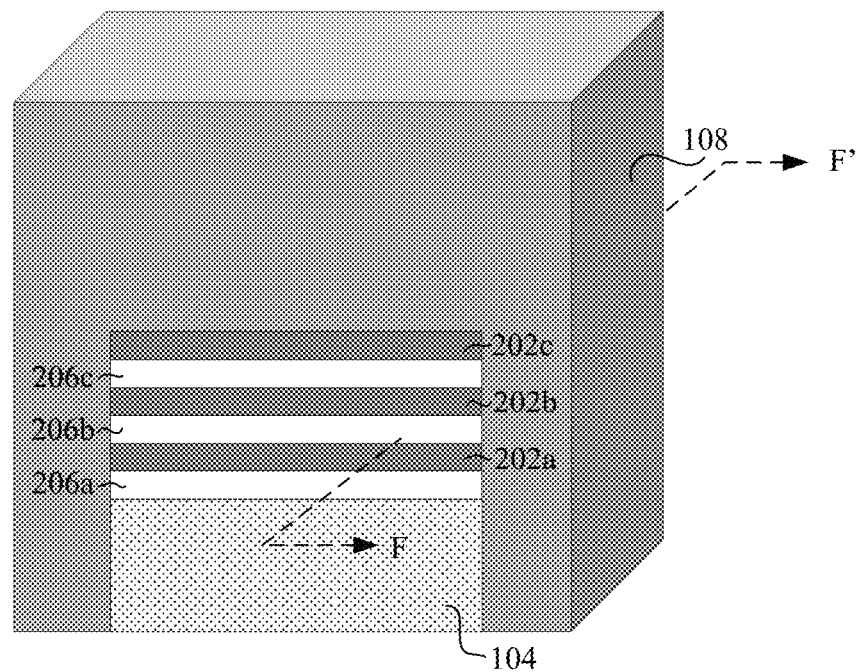
Figure 6B:
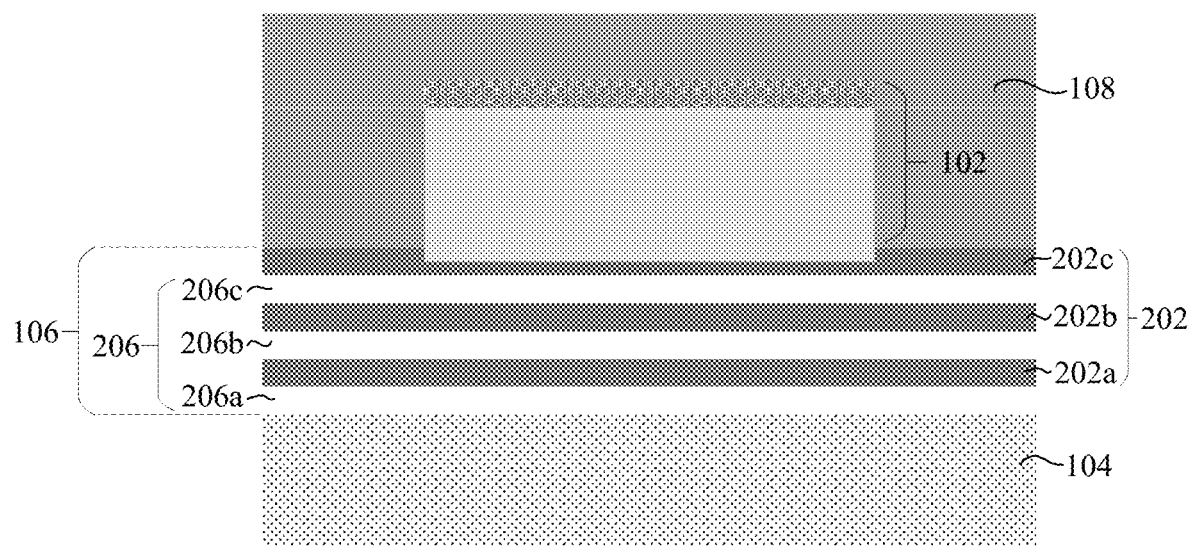

Referring to FIGS. 6A and 6B, there is shown a perspective view and a cross section view respectively of a partially processed structure after removal of the conversion layers in accordance with the present disclosure. The conversion layers may be removed by a wet etch or a dry etch process that is selective to the material of the conversion layers. In one embodiment, the conversion layers are selectively removed by performing a wet etch process that is selective to germanium or SiGe. After removal of the conversion layers, a plurality of cavities 206 is formed. The cavities 206 may have uniform spacing or non-uniform spacing (not shown). Non-uniform spacing may be formed by removal of non-uniform conversional layers, as described herein. As shown in FIG. 6B, the heterostructure 106 includes alternating layers of cavities 206a, 206b and 206c and semiconductor material layers 202a, 202b and 202c. In some embodiments, there may be residual materials of the conversion layers remaining in the cavities 206 (not shown). Advantageously, as shown in FIG. 6A, the formed anti-reflection layer 108 functions as a support structure by providing mechanical support for the plurality of semiconductor material layers 202 in the heterostructure 106, and prevents the cavities 206 in the heterostructure 106 from collapsing during subsequent processing steps.

Figure 7A:
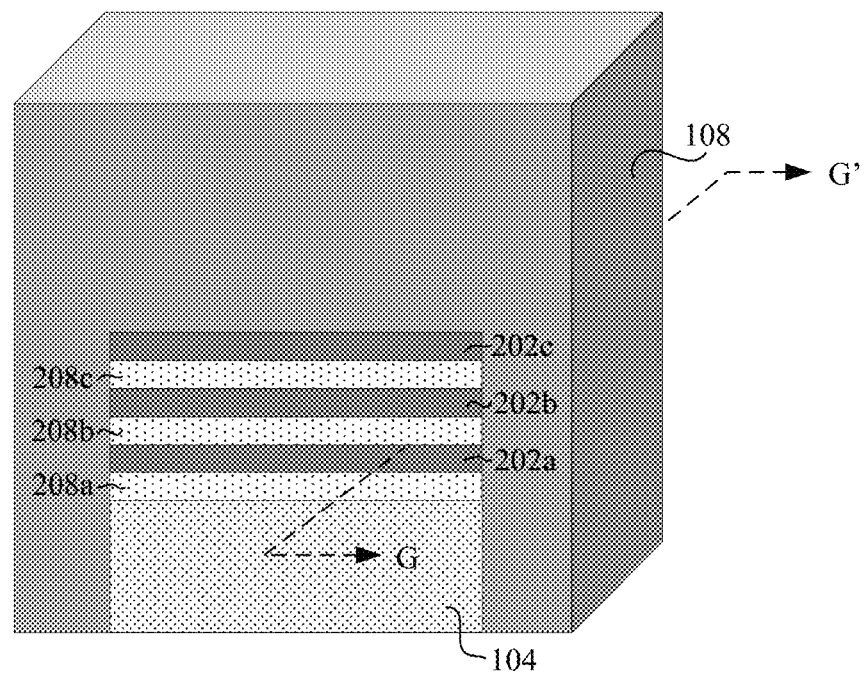
Figure 7B:
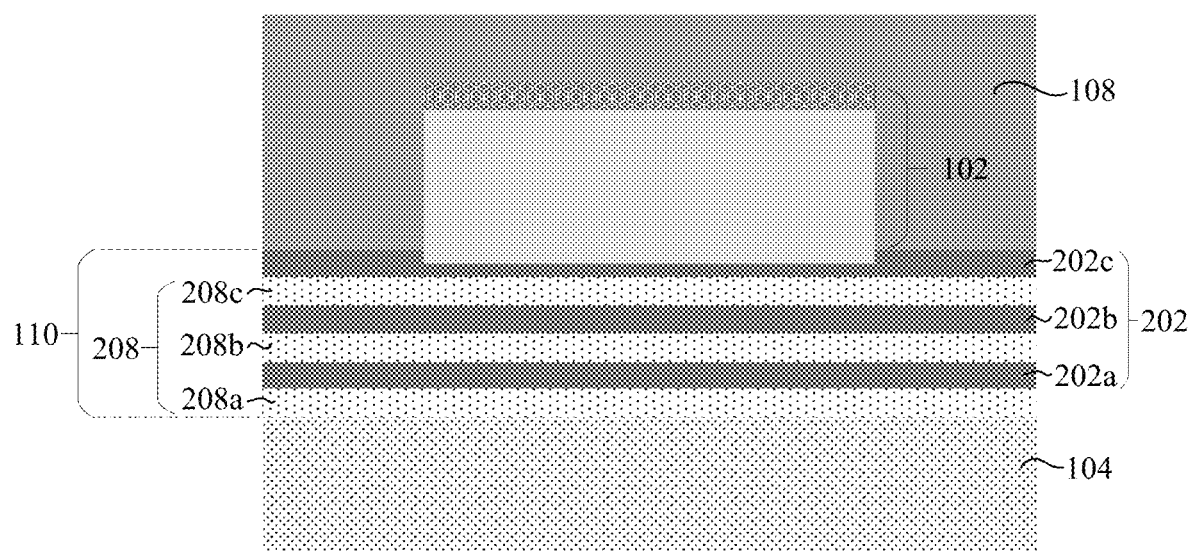

Referring to FIGS. 7A and 7B, there is shown a perspective view and a cross section view, respectively, of a partially processed structure after forming a Bragg reflector 110 between the semiconductor detector 102 and the substrate 104. In one embodiment, the previously formed cavities are filled with a dielectric material to form a plurality of dielectric material layers 208. As shown in FIG. 7B, the Bragg reflector 110 has alternating layers of semiconductor material layers 202a, 202b and 202c and dielectric material layers 208a, 208b and 208c. The semiconductor material layers 202a, 202b and 202c have a different refractive index from the dielectric material layers 208a, 208b and 208c.

As shown in FIG. 7B, the alternating layers of the Bragg reflector 110 are stacked vertically over the substrate 104, with a top layer 202c and a bottom layer 208a. The top layer 202c may be of a same or different material from the bottom layer 208a. In another embodiment, the Bragg reflector 110 includes the semiconductor material as the top layer 202c and the dielectric material as the bottom layer 208a. For example, the Bragg reflector includes, but not limited to, five to twenty alternating layers of semiconductor material and dielectric material. The semiconductor material and dielectric material layers may have uniform or non-uniform thickness.

The filling of dielectric materials in the previously formed cavities may be performed by any deposition techniques such as atomic layer deposition (ALD), CVD, PVD or epitaxy techniques, such as molecular beam epitaxy, liquid phase epitaxy, vapor phase epitaxy, or solid phase epitaxy. In some embodiments, the filling of dielectric materials in the cavities is performed with CVD or ALD. The dielectric material used to fill the cavities may be an oxide. In various embodiments, the dielectric material for the dielectric material layers 208 may include, but not limited to, germanium oxide, SiGe oxide, silicon oxynitride (SiON), silicon dioxide ($SiO_2$), carbon-doped silicon dioxide materials, fluorinated silicate glass (FSG), boro-phospho-silicate glass (BPSG), silicon oxycarbide, SiCOH dielectrics, fluorine doped silicon oxide, spin-on glasses, silsesquioxanes, hydrogen silsesquioxane (HSQ), methyl silsesquioxane (MSQ), mixtures or copolymers of HSQ and MSQ, or any combination of these materials. In one embodiment, silicon dioxide is used to fill the cavities.

Figure 8:
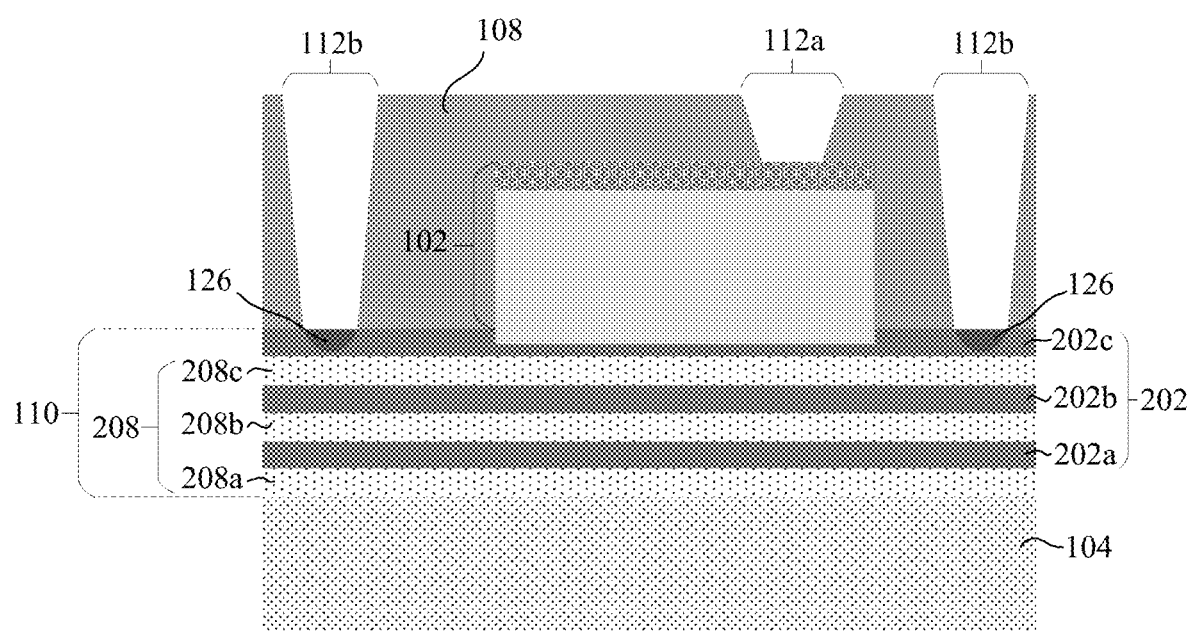
FIG. 8 shows a cross section view of a partially processed structure after performing lithography and etching processes to form via openings according to embodiments of the present disclosure.

Referring to FIG. 8, via openings are formed in the anti-reflection layer 108 in accordance with an embodiment of the present disclosure. The via openings in the anti-reflection layer 108 may be formed by lithography and etching processes. The via openings may be formed over the semiconductor detector 102, the top layer 202c, or both. In one embodiment, the anti-reflection layer 108 is etched to form a detector via opening 112a (which exposes a portion of the semiconductor detector 102), and a reflector via opening 112b (which exposes a portion of the top layer 202c). In another embodiment, at least one reflector via opening 112b is formed over the top layer 202c.

Electrical connections are subsequently formed on the semiconductor detector 102 and the Bragg reflector 110. Formation of the electrical connections may include doping of the top layer of the Bragg reflector and forming via contacts.

The top layer 202c may be doped with suitable dopants through the reflector via opening 112b. The doping may be performed by any suitable ion-implantation or solid source diffusion technique. Suitable dopants used herein may include, but not limited to, N-type dopants (e.g. phosphorous, arsenic), P-type dopants (e.g. boron). The doped regions 126 formed in the top layer 202c are shown in FIG. 8. Alternatively, the doping of the top layer 202c may be performed through in-situ doping during the epitaxial growth of the heterostructure described in FIGS. 1A-1B and 2A-2B.

Figure 9A:
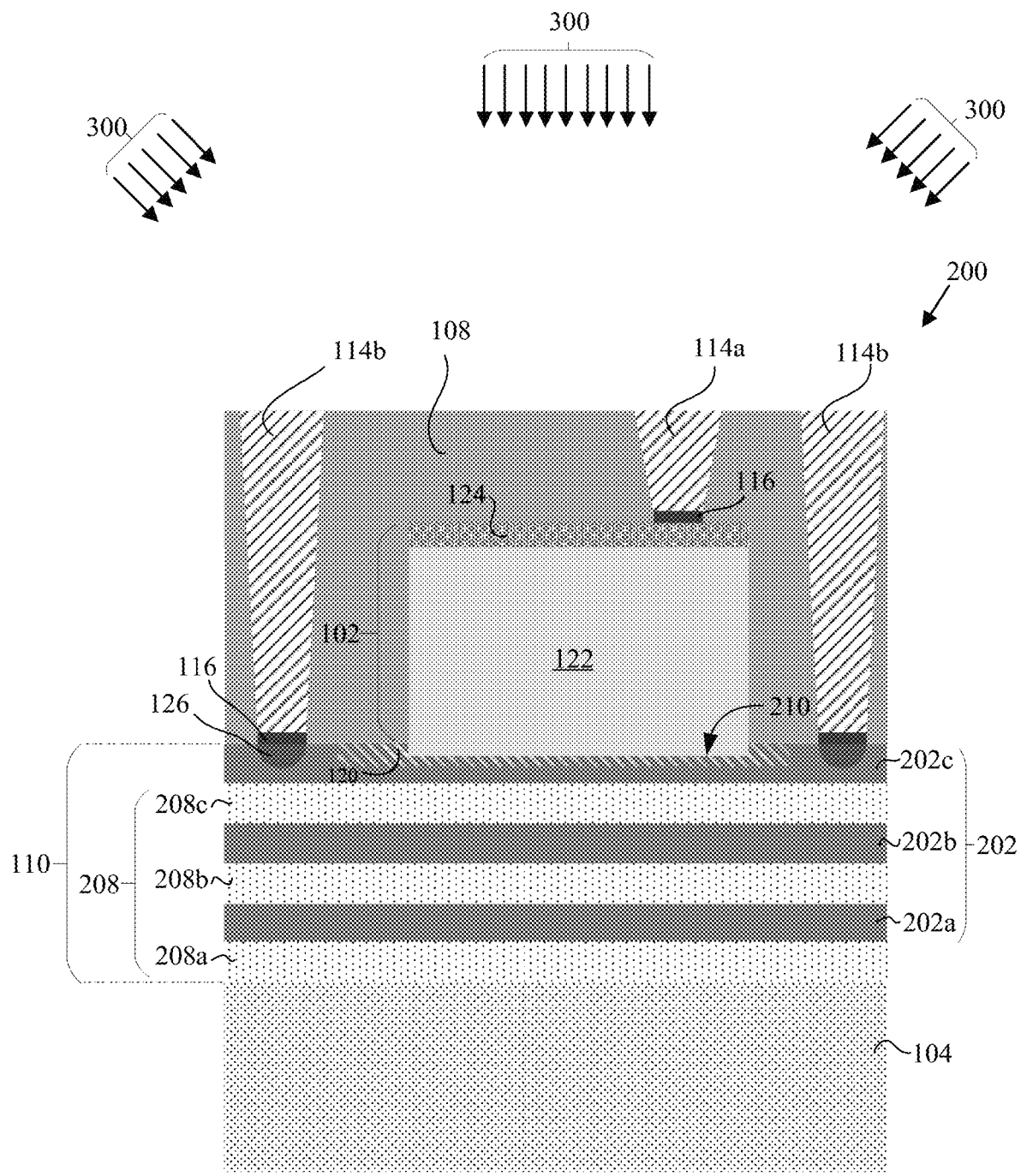
FIGS. 9A and 9B show cross section views of exemplary photodetectors according to embodiments of the present disclosure.
Figure 9B:
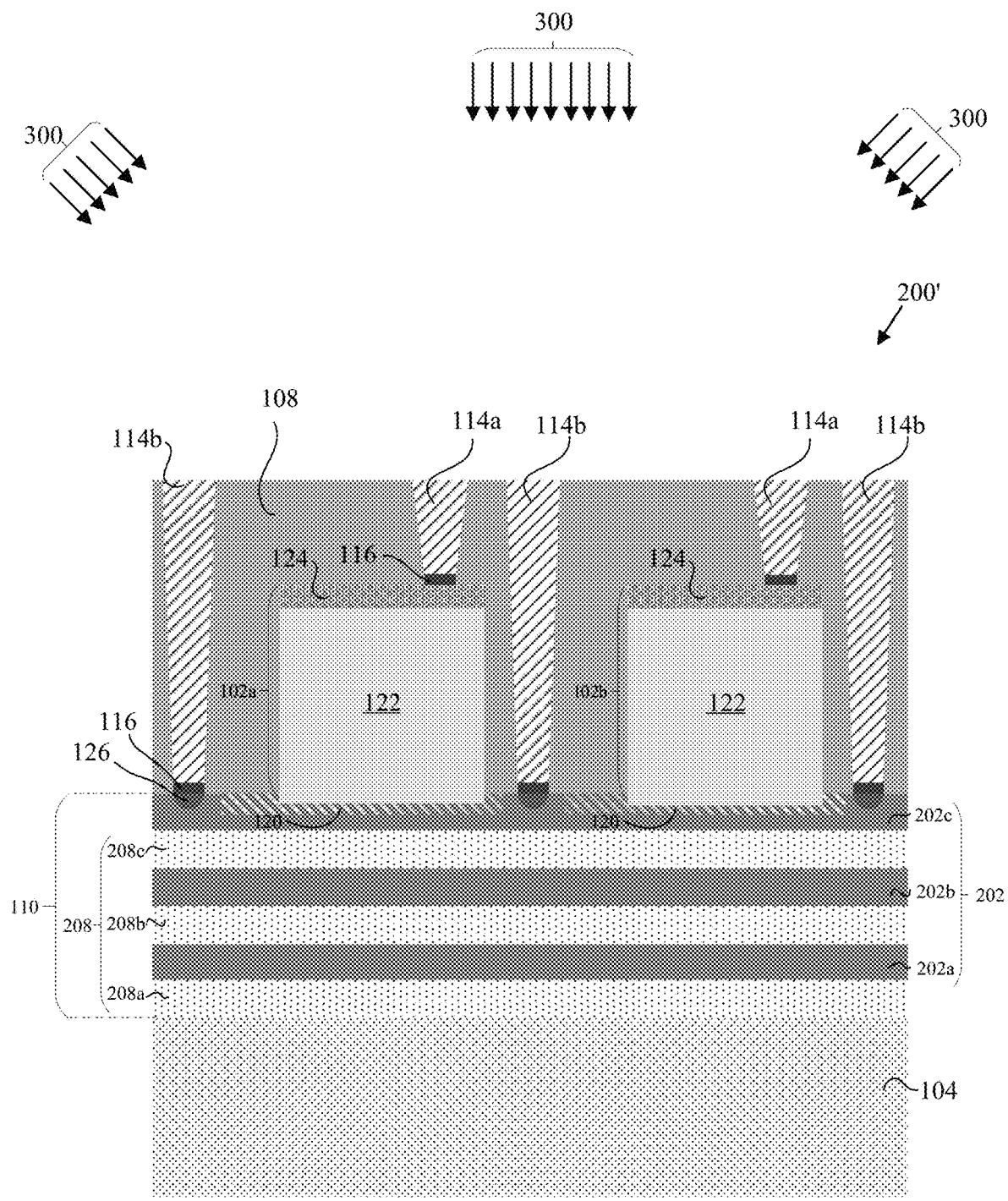

Referring to FIGS. 9A and 9B, cross section views of embodiments of photodetectors 200 and 200' are shown. FIG. 9A illustrates an example of the photodetector 200 having a semiconductor detector 102 disposed on the Bragg reflector 110, whereas FIG. 9B illustrates another example of the photodetector 200' having more than one semiconductor detector 102 disposed on the Bragg reflector 110. The photodetectors 200 and 200' are formed in accordance with various embodiments of the present disclosure. The photodetectors 200 and 200' includes a semiconductor detector 102 disposed on the Bragg reflector 110. As described herein, the Bragg reflector has a top layer 202c and a bottom layer 208a. In one embodiment, a back side 210 of the semiconductor detector 102 is disposed on the top layer 202c and the bottom layer 208a is disposed on the substrate 104. In another embodiment, the semiconductor detector 102 is disposed in a recessed portion of the top layer 202c.

As described above, the doping of the semiconductor detector 102 and the top layer 202c may form PN or PIN junctions (i.e., an electrical pathway) in the photodetector of the present disclosure. An example illustrating a PIN junction shall be described with reference to FIGS. 9A and 9B.

As used herein, "intrinsic doped" refers to a doped region that is substantially free of extrinsic doping atoms, but may still contain charge carriers provided by other doped portions of the structure. Also, "heavily doped" refers to a doped region having the highest dopant concentration (e.g., N++ doped or P++ doped region)—about $10^{20}$ atoms/cm$^3$. and "lightly doped" refers to a doped region having a medial dopant concentration (e.g., N+ doped or P+ doped region) relative to the "heavily doped" and the "intrinsic doped" having a dopant concentration of about $10^{18}$ atoms/cm$^3$.

The doped regions 126 of the top layer 202c are doped to form N++"heavily doped" regions, while a portion of the top layer 202c interfacing the semiconductor detector 102 is an N+"lightly doped" region 120. The "lightly doped" region 120 is formed by the in-situ doping of the top layer 202c during the epitaxial growth of the heterostructure described herein. The doped layer 124 in the semiconductor detector 102 is a P++"heavily doped" region. The remaining portion of the semiconductor detector 102 forms an "intrinsic doped" region 122 (which functions as the intrinsic region of a PIN junction). The "intrinsic doped" region may contain charge carriers provided by the P++ and the N+ doped regions. Optionally, a P+"lightly doped" region (not shown) may be formed in the semiconductor detector 102 between the "intrinsic doped" region 122 and the "heavily doped" region 124.

The via openings are filled with conductive materials to form via contacts 114a and 114b, as shown in FIGS. 9A and 9B. In one embodiment, at least one reflector via contact 114b is formed on the top layer 202c. In another embodiment, a detector via contact 114a is formed on a front side of the semiconductor detector 102. The conductive materials may include, but not limited to, copper, cobalt or aluminum. In another embodiment, the conductive material is preferably copper.

The via contacts 114a and 114b are formed on the doped regions 126 of the top layer 202c and the doped layer 124 in the semiconductor detector 102 to provide electrical connections to the PN or PIN junction of the photodetector described herein. In one embodiment, silicide liners 116 may be formed at the interface between the via contacts 114a and 114b and the doped region 126 and the doped layer 124. The dielectric material layer 208c directly beneath the top layer 202c may function as an insulating layer. Advantageously, the presence of the dielectric material layer 208c may reduce current leakage from the doped top layer 202c during operation of the photodetector.

A non-limiting description of the operation of exemplary photodetectors 200 and 200' shall be described with reference to FIGS. 9A and 9B. Illuminated light 300 from an illumination source (not shown) is incident on the anti-reflection layer 108 of the photodetectors 200 and 200', and may be normal or angled to a surface of anti-reflection layer 108. The incident light passes through the anti-reflection layer 108 to reach the semiconductor detector 102. A portion of the incident light may be absorbed by the semiconductor detector 102, while the remainder may escape through the semiconductor detector 102 and reach the Bragg reflector 110. Each layer of the Bragg reflector 110 will cause a partial reflection of the escaped light waves back towards the semiconductor detector 102. During the reflection back, there may be constructive interference, thereby increasing the efficiency of light absorption by the semiconductor detector 102.

Figure 10A:
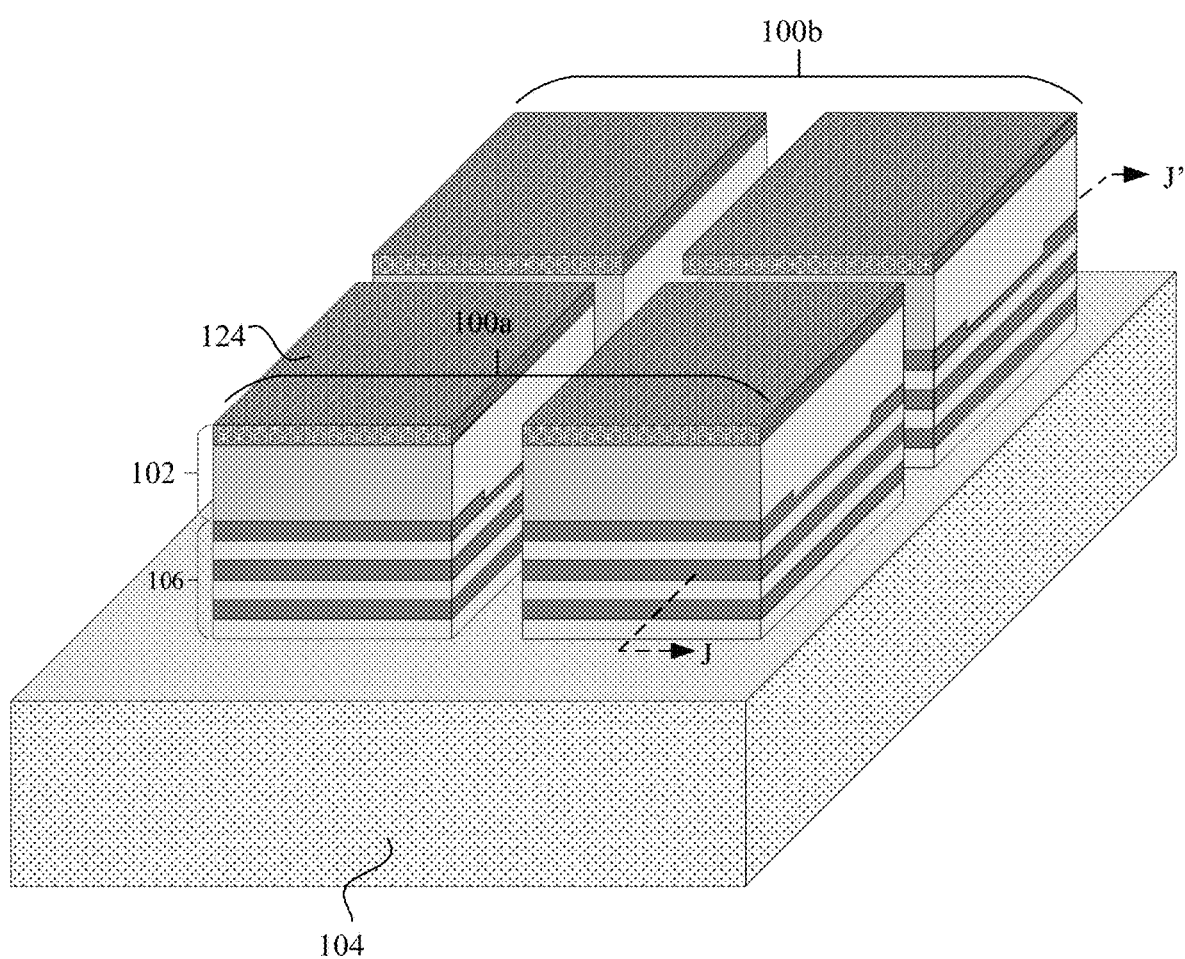
FIGS. 10A, 11A and 12A show perspective views of a partially processed structure at successive stages of an alternative method of forming a photodetector in accordance with another embodiment of the present disclosure.

The photodetector of the present disclosure may include a plurality of Bragg reflectors disposed on a substrate. Referring to FIG. 10A, there is shown a perspective view of an alternative embodiment of a partially processed structure at successive stages of forming a photodetector. The partially processed structure may be formed by using lithography and etching processes on the structure shown in FIGS. 1A-1B and 2A-2B, thereby forming a plurality of heterostructures spaced apart from one another. The partially processed structure may include a plurality of heterostructures 106 disposed on the substrate 104. Semiconductor detectors 102 are disposed on the heterostructures 106. The plurality of heterostructures 106 includes a first array 100a of heterostructures and a second array 100b of heterostructures 106, as shown in FIG. 10A.

Figure 10B:
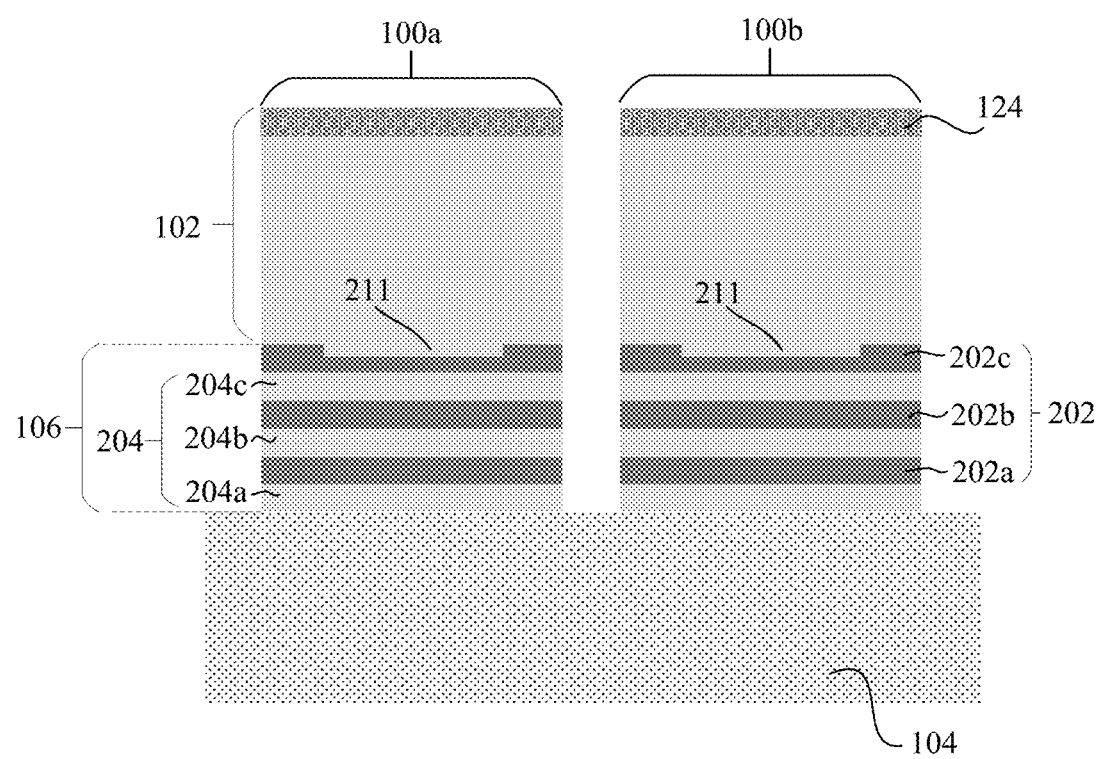
FIGS. 10B, 11B and 12B show cross section views of the same partially processed structure (taken along lines J-J', K-K' and L-L' as indicated in FIGS. 10A, 11A and 12A, respectively) according to another embodiment of the present disclosure.

FIG. 10B depicts the cross section view of the same partially processed structure along the cross section line J-J' in FIG. 10A. As shown in FIG. 10B, each heterostructure 106 has a top layer 202c and a bottom layer 204a. As described herein, each heterostructure 106 includes alternating layers of semiconductor material layers 202a, 202b and 202c, and conversion layers 204a, 204b and 204c. The semiconductor material layers 202a, 202b and 202c are of a different material from the conversion layers 204a, 204b and 204c, and are stacked vertically over the substrate 104. As shown in FIG. 10B, the semiconductor detectors 102 are disposed in a recess 211 of the top layer 202c.

Figure 11A:
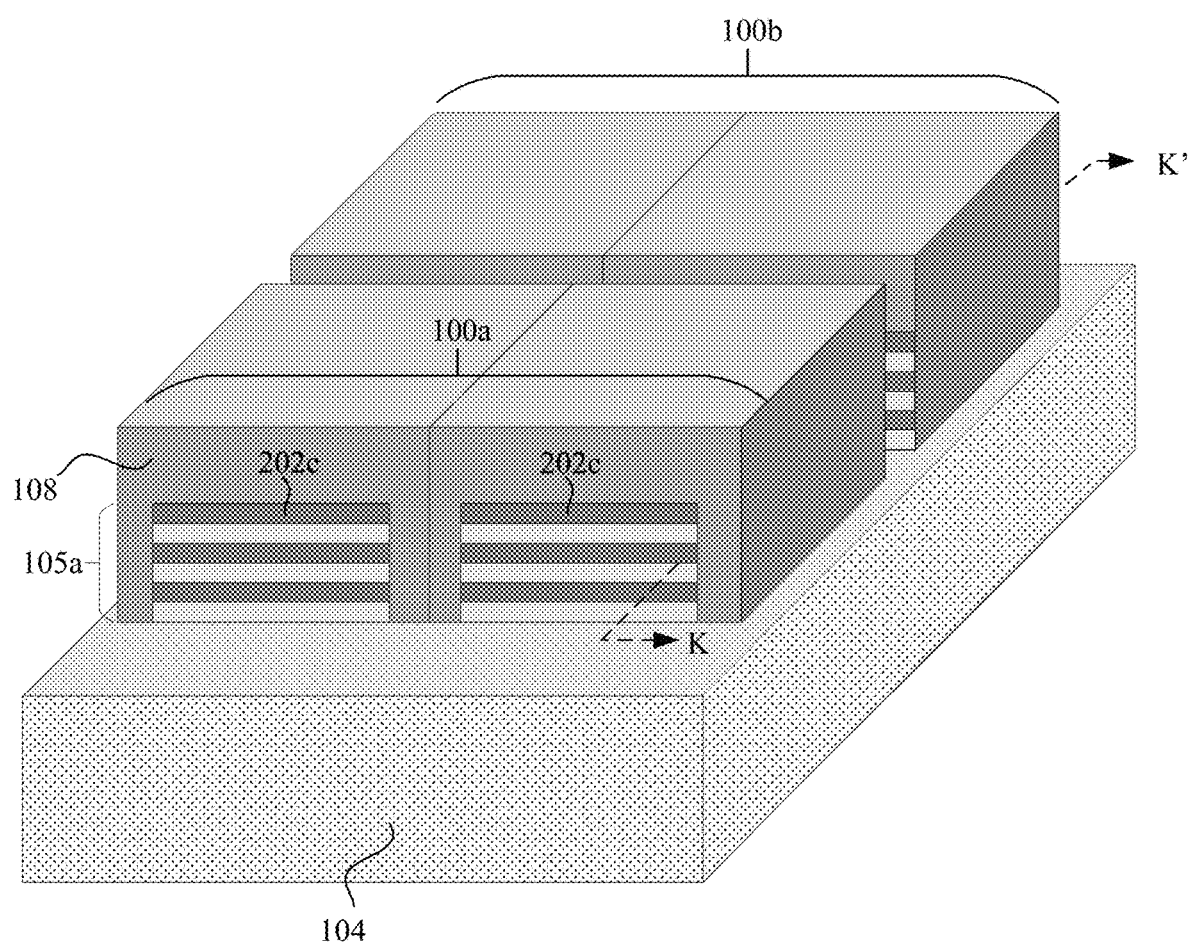
Figure 11B:
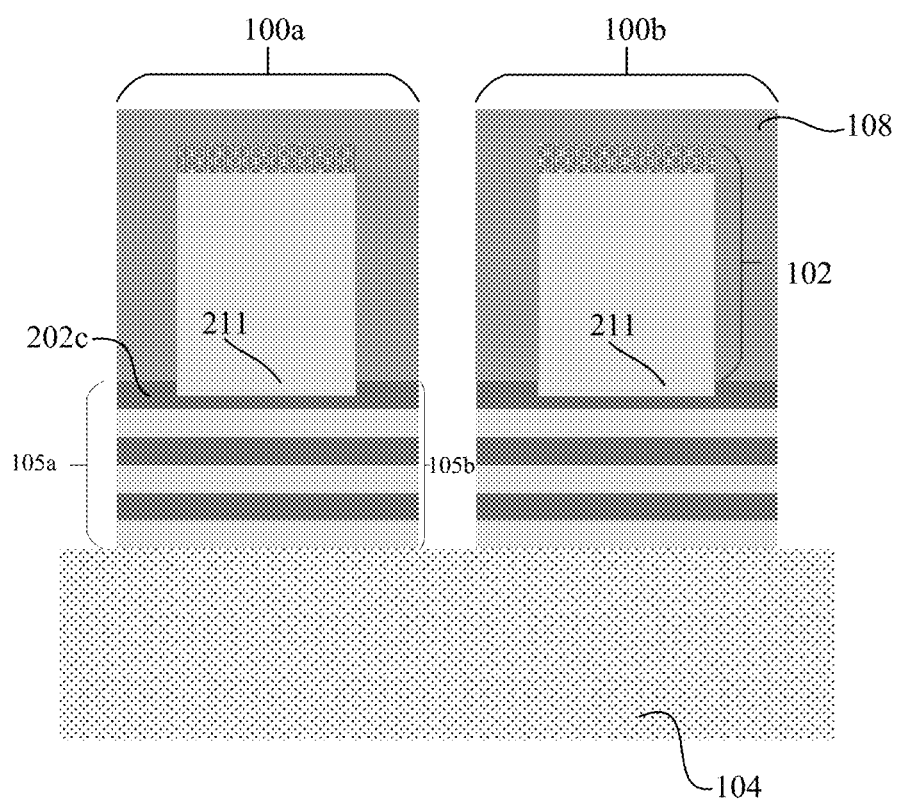

Referring to FIGS. 11A and 11B, an alternative embodiment of a partially processed structure including an anti-reflection layer 108 is shown. The semiconductor detectors 102 may be etched using methods described in FIGS. 3A-3B and 4A-4B to expose the top layer 202c of each heterostructure 106 and to form one or more semiconductor detector structures 102 on each heterostructure 106. Next, the anti-reflection layer 108 is formed on the semiconductor detectors 102 and the heterostructures 106 in the same manner described in FIGS. 3A-3B and 4A-4B. For example, the anti-reflection layer 108 is deposited to cover top and side surfaces of the semiconductor detectors 102 and also surrounds the heterostructures 106. Lithography and etching processes are then performed on the deposited anti-reflection layer 108 to expose the sides 105a and 105b of the heterostructures 106.

Figure 12A:
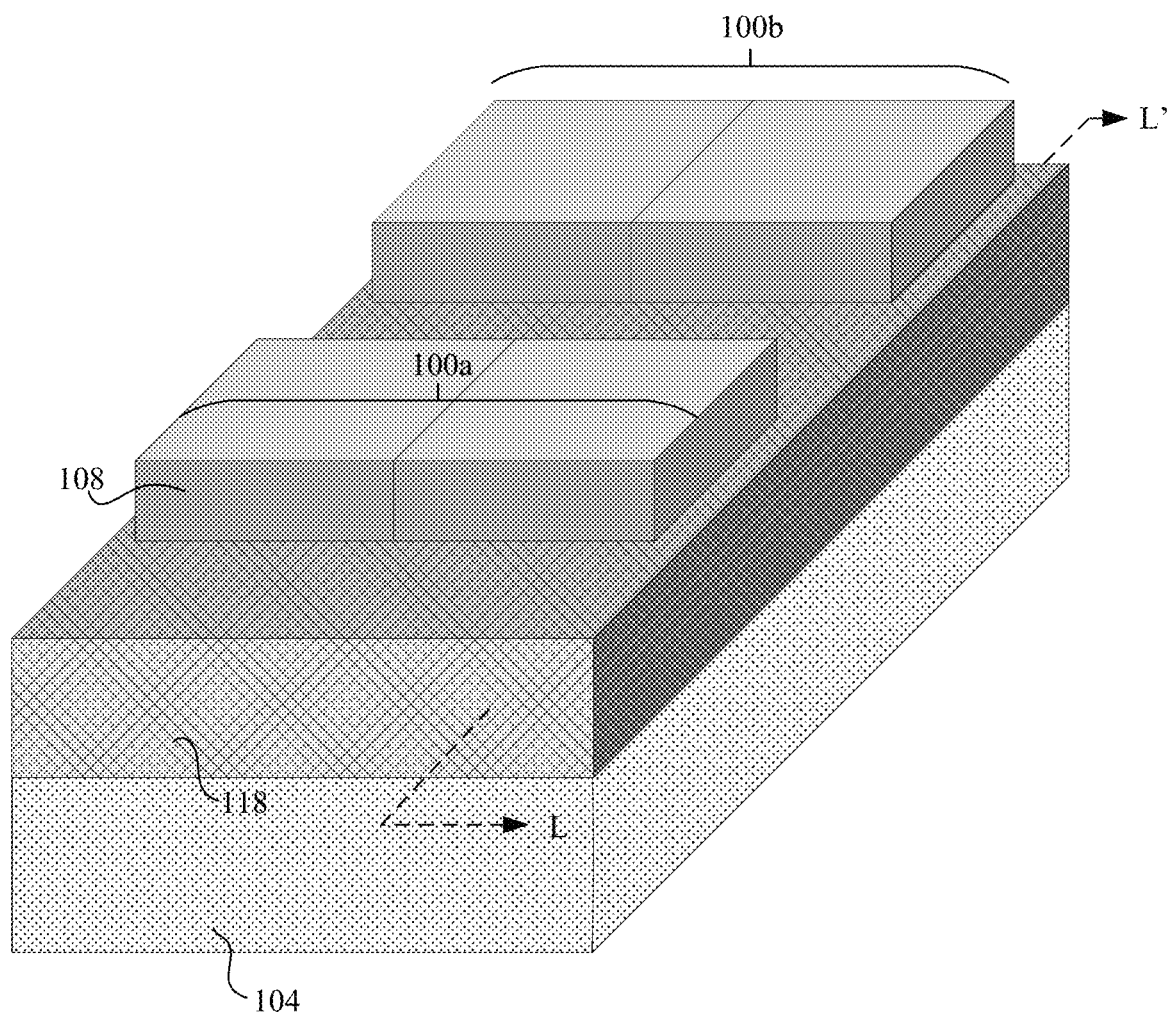
Figure 12B:
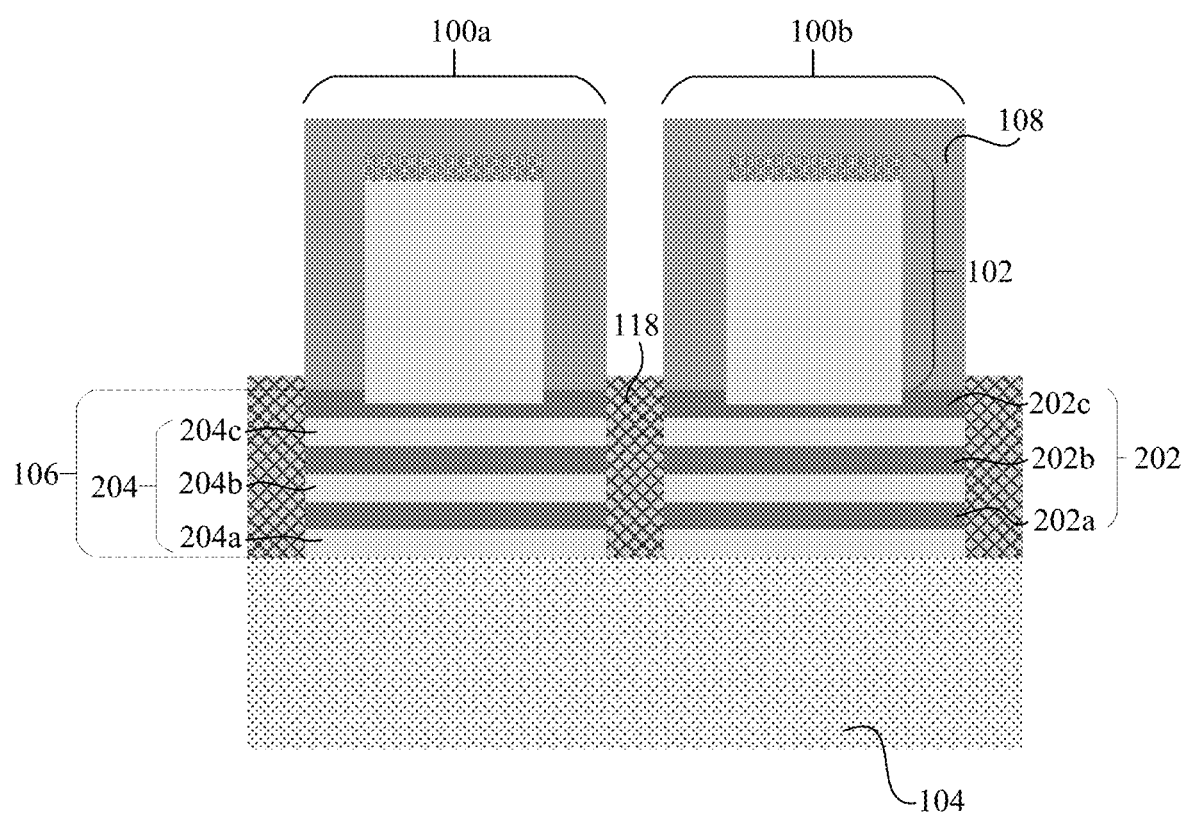

Referring to FIGS. 12A and 12B, there is shown an alternative embodiment of a partially processed structure after forming an inter-array dielectric layer 118. The inter-array dielectric layer 118 is formed by a deposition process to surround the heterostructures 106. In particular, the deposition of the inter-array dielectric layer 118 covers the exposed sides 105a and 105b. The deposition process may be performed using any deposition techniques such as CVD, PVD, or spin-coating. The inter-array dielectric layer 118 may include an oxide. In some embodiments, the inter-array dielectric layer 118 includes silicon dioxide.

An oxidation process is also performed on the partially processed structure described in FIGS. 12A and 12B. In one embodiment, the oxidation process includes a germanium condensation process. Advantageously, the inter-array dielectric layer 118 may function as a provider of oxygen atoms for the oxidation process, while simultaneously functioning as an electrical insulator.

Figure 13:
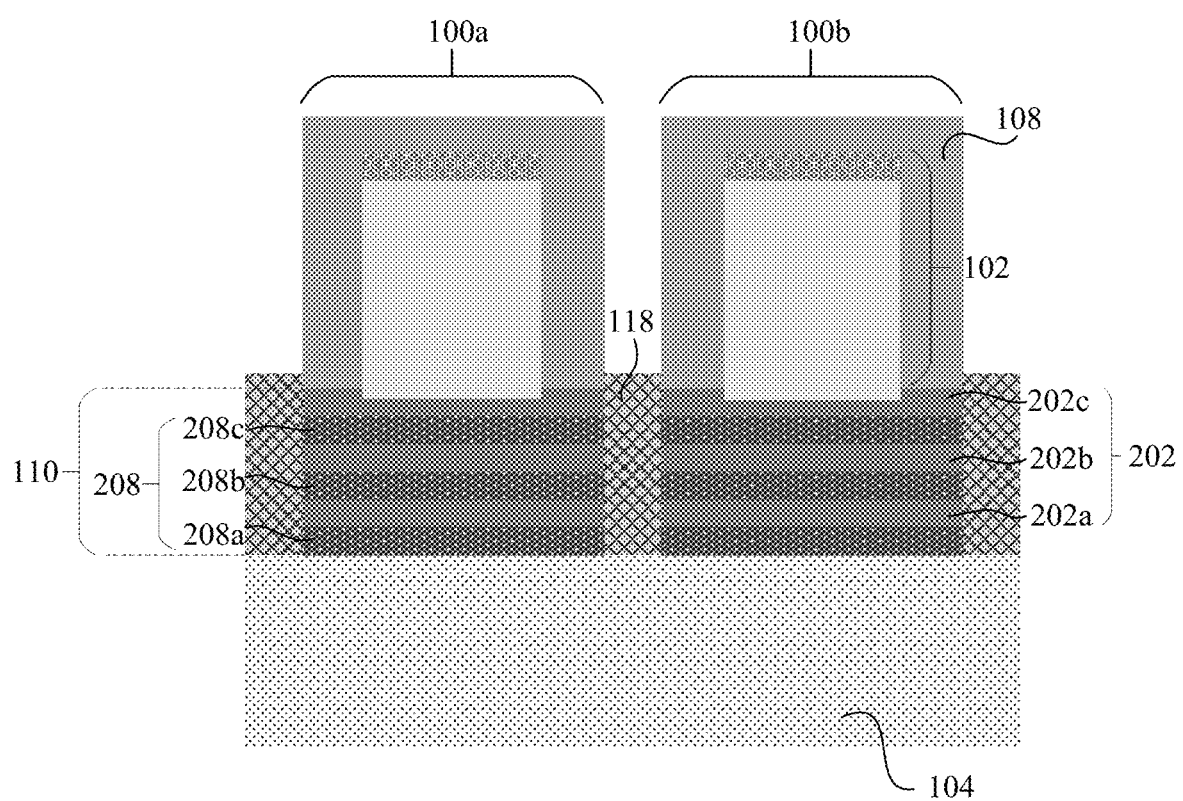
FIG. 13 shows a cross section view of the same partially processed structure shown in FIG. 12B after performing an oxidation process according to embodiments of the present disclosure.

Referring to FIG. 13, there is shown a cross section view of the partially processed structure after performing an oxidation process. The oxidation process includes an annealing step. In some embodiments, the oxidation process includes exposing the partially processed structure to an oxygen rich atmosphere. For example, the structure shown in FIGS. 12A and 12B may be treated with additional oxygen gas during annealing step to accelerate the oxidation process. Advantageously, the presence of the anti-reflection layer 108 functions as a protective layer to prevent oxidation of the semiconductor detector 102.

The oxidation process converts the conversion layers to form the dielectric material layers. The formed dielectric material layers 208 and the semiconductor material layers 202 constitute the Bragg reflector 110 described herein. The dielectric material layers 208 formed by the oxidation process may include an oxide. In some embodiments, the oxide is germanium oxide, or SiGe oxide. In one embodiment, the SiGe oxide has a chemical formula of $Si_{(1-x)}Ge_xO_y$, wherein x and y are in stoichiometric ratio.

For the oxidation process, SiGe and silicon are used as non-limiting examples of the conversion layers and semiconductor material layers, respectively and silicon dioxide is used as a non-limiting example of the inter-array dielectric layer. The silicon dioxide inter-array layer may be deposited to surround the SiGe conversion layer and silicon layer. Annealing is then performed to oxidize SiGe to $Si_{(1-x)}Ge_xO_y$. In addition, $Si_{1-x}Ge_xO_y$ is used as a non-limiting example of the formed dielectric material layer. The oxidation rate of SiGe may be significantly faster when compared to the oxidation rate of silicon during annealing. The oxidation rate of SiGe may be controlled by temperature.

The annealing step may be performed at a temperature range of about 600° C. to about 1100° C. It will be appreciated by those skilled in the art that the oxidation of SiGe conversion layers 204a, 204b and 204c may include a germanium condensation process.

The alternative embodiment of the partially processed structure described in FIG. 13 may undergo successive processing steps, as described herein, to form the photodetector according embodiments of the present disclosure. For example, electrical connections are subsequently formed on the semiconductor detector 102 and the Bragg reflector 110, as described in FIGS. 8 and 9A-9B.

Figure 14A:
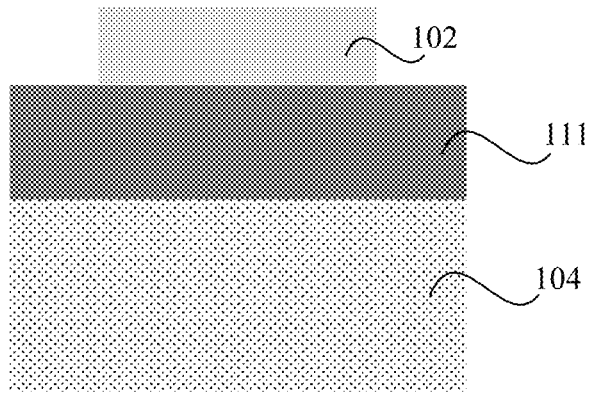
FIGS. 14A and 14B show cross section views of comparative examples of photodetectors integrating a silicon layer with a semiconductor detector.
Figure 14B:
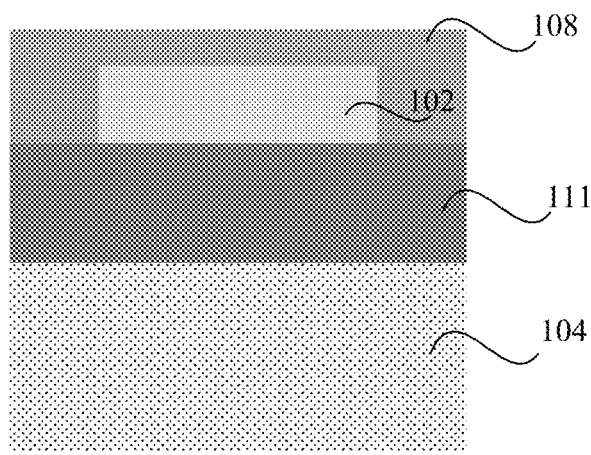
Figure 14C:
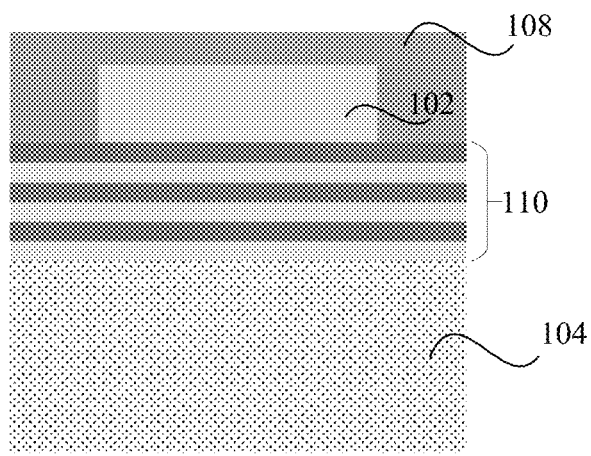
FIG. 14C shows a cross section view of the exemplary photodetector integrating a Bragg reflector with a semiconductor detector according to embodiments of the present disclosure.

A study comparing the effects of light absorption between the comparative examples shown in FIGS. 14A and 14B and the exemplary photodetector shown in FIG. 14C was conducted using a computer simulation. The simulation was performed using Matlab simulation software. The photodetectors shown in FIGS. 14A to 14C were modelled using a Transmission Matrix method.

Referring to FIGS. 14A and 14B, there is shown cross section views of comparative photodetectors integrating a silicon layer with a semiconductor detector. On the other hand, FIG. 14C shows a cross section view of an exemplary photodetector integrating a Bragg reflector with a semiconductor detector according to embodiments of the present disclosure. As shown in FIGS. 14A and 14B, a silicon layer 111 is deposited on a substrate 104. A semiconductor detector 102 is deposited on the silicon layer 111. In FIG. 14B, an anti-reflection layer 108 is deposited on the semiconductor detector 102 and the silicon layer 111.

In the simulation study, the comparative example shown in FIG. 14A was labelled "Air-Ge—Si-Box", the comparative example shown in FIG. 14B was labelled "AR-Ge—Si-Box" and the photodetector example shown in FIG. 14C was labelled "AR-Ge-Bragg-Box". In all three photodetectors, the substrate 104 was a standard silicon substrate with a buried silicon dioxide layer, and the semiconductor detector 102 was a germanium detector. The anti-reflection layer 108 shown in FIGS. 14B and 14C was silicon nitride with a thickness of 200 nm. The Bragg reflector used in the photodetector shown in FIG. 14C contained alternating layers of silicon and germanium oxide, where the silicon had a thickness of 100 nm and the germanium oxide had a thickness of 240 nm.

Figure 15A:
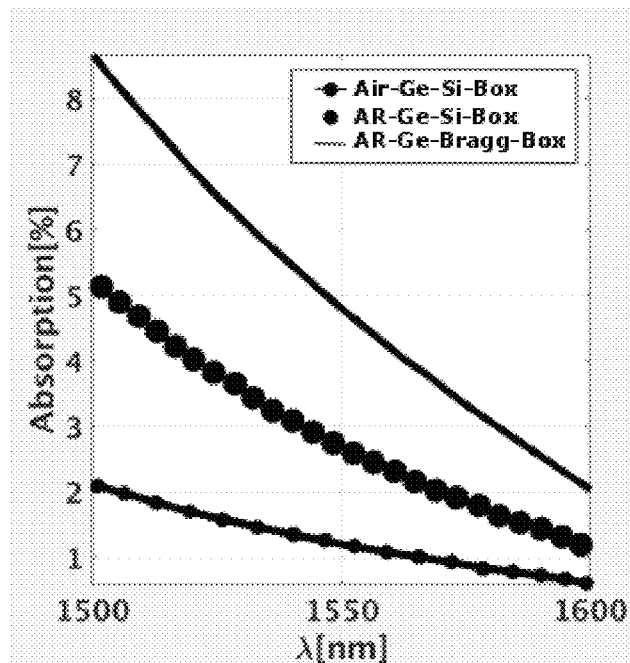
FIGS. 15A and 15B are graphs depicting the effects of light absorption between the exemplary photodetector shown in FIG. 14C with comparative photodetectors shown in FIGS. 14A and 14B.
Figure 15B:
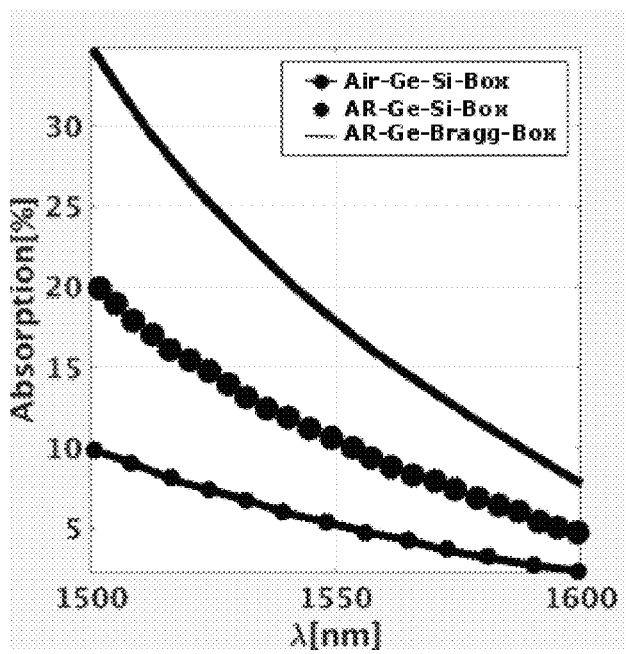

FIGS. 15A and 15B show graphs depicting the comparative effects of light absorption between the photodetectors shown in FIGS. 14A and 14B and 14C. FIG. 15A shows the results of light absorption on a 250 nm thick germanium detector, while FIG. 15B shows the results of light absorption on a 1000 nm thick germanium detector. As shown in both FIGS. 15A and 15B, the photodetector "AR-Ge-Bragg-Box" shown in FIG. 14C has an absorption percentage that is (i) about 3 times higher than the comparative example "Air-Ge—Si-Box" shown in FIG. 14A at all wavelengths of light, and (ii) about 2 times higher than the comparative example "AR-Ge—Si-Box" shown in FIG. 14B. Advantageously, it was found that the integration of Bragg reflector with a semiconductor detector enhances light absorption.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor devices and methods disclosed herein may be employed in manufacturing a variety of different integrated circuit products and modules, including, but not limited to, optoelectronic modules, LIDAR instrumentation and LIDAR systems, etc.

What is claimed is:

1. A photodetector comprising:
    a substrate;
    a Bragg reflector disposed on the substrate, wherein the Bragg reflector comprises alternating layers of a semiconductor material and a dielectric material; and
    a semiconductor detector disposed on the Bragg reflector.

2. The photodetector of claim 1, wherein the alternating layers of the Bragg reflector include the semiconductor material as a top layer and the dielectric material as a bottom layer disposed on the substrate.

3. The photodetector of claim 2, wherein the semiconductor detector is disposed in a recessed portion of the top layer of the Bragg reflector.

4. The photodetector of claim 3, wherein the substrate includes a bulk semiconductor substrate or a semiconductor-on-insulator substrate.

5. The photodetector of claim 2, wherein the top layer of the Bragg reflector includes doped regions.

6. The photodetector of claim 1, wherein the semiconductor detector includes a germanium containing compound.

7. The photodetector of claim 1, further comprising an anti-reflection layer disposed on the semiconductor detector.

8. The photodetector of claim 7, wherein the semiconductor detector has top and side surfaces that are covered by the anti-reflection layer, wherein the anti-reflection layer generates stress on the semiconductor detector.

9. The photodetector of claim 8, wherein the anti-reflection layer includes a nitride compound.

10. A photodetector comprising:
    a substrate;
    a plurality of Bragg reflectors disposed on the substrate, wherein each Bragg reflector comprises alternating layers of a semiconductor material and a dielectric material;
    an inter-array dielectric layer separating each Bragg reflector; and
    one or more semiconductor detectors disposed on each Bragg reflector.

* * * * *